(12) United States Patent
Takagi

(10) Patent No.: US 6,999,485 B2
(45) Date of Patent: Feb. 14, 2006

(54) SEMICONDUCTOR OPTICAL DEVICE

(75) Inventor: Kazuhisa Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 407 days.

(21) Appl. No.: 10/405,631

(22) Filed: Apr. 3, 2003

(65) Prior Publication Data

US 2003/0189964 A1   Oct. 9, 2003

(30) Foreign Application Priority Data

Apr. 9, 2002 (JP) .......................... P 2002-106650

(51) Int. Cl.
| | |
|---|---|
| H01S 3/13 | (2006.01) |
| H01S 3/14 | (2006.01) |
| H01S 5/00 | (2006.01) |
| H01S 3/08 | (2006.01) |

(52) U.S. Cl. .................. 372/29.02; 372/39; 372/43.01; 372/96; 372/102

(58) Field of Classification Search .................. None
See application file for complete search history.

(56) References Cited

U.S. PATENT DOCUMENTS 4,815,082 A   3/1989   Isshiki et al.
5,119,393 A   6/1992   Oka et al.

FOREIGN PATENT DOCUMENTS

JP   4-783   1/1992

Primary Examiner—Minsun Oh Harvey
Assistant Examiner—Armando Rodriguez
(74) Attorney, Agent, or Firm—Leydig, Voit & Mayer, Ltd.

(57) ABSTRACT

A kink-free semiconductor optical device stabilizing laser oscillation and producing a high optical performance. The semiconductor optical device includes a beam waveguide extending in a longitudinal direction between a pair of end surfaces. The beam waveguide includes an active layer having a quantum well structure with at least one well layer and two barrier layers, and a pair of cladding layers sandwiching the active layer. The active layer has first and second regions in the longitudinal direction, the photon density in the first region being larger than in the second region. The first region has a differential gain greater than the second region so that variation of refractive index across the beam waveguide is reduced.

11 Claims, 14 Drawing Sheets

SEMICONDUCTOR OPTICAL DEVICE

BACKGROUND OF THE INVENTION

1) Technical field of the Invention

The present invention relates to a semiconductor optical device, and in particular, relates to a semiconductor optical device used for an optical communication system and an optical disc device.

2) Description of Related Arts

Referring to FIGS. 21 and 22, a semiconductor optical device as denoted by numerical reference 500 according to the prior art will be described hereinafter. FIG. 21 is a perspective view of a λ/4-shifted distributed-feedback semiconductor laser device 500 as an example of the semiconductor optical device, and FIG. 22 is a cross sectional view taken along the line of XXII—XXII of FIG. 21.

The distributed-feedback semiconductor laser device 500 includes, in general, a buffer layer 2, and an active layer 3 subsequently formed on a substrate 1. The active layer 3 is a multiple quantum well (MQW) layer. Also provided on the active layer 3 are cladding layers 4 and 8. The active layer 3 is sandwiched between the buffer layer 2 and the cladding layer 4.

Also, grown adjacent to both end surfaces are p-type blocking layers 5, 7 and an n-type blocking layer 6 of sandwiched therebetween.

A contact layer 9, an insulating layer 10, and a cathode electrode 11 are formed in order on the cladding layer 8. Also, formed on the bottom surface of the substrate 1 are anode electrodes 12, 13.

Further, a plurality of beam guiding layers 14 are embedded within the cladding layer 4, performing as diffraction gratings. A phase shifting region 15 of the diffraction gratings is provided adjacent to a middle point between both end surfaces.

In the distributed-feedback semiconductor laser device 500, as illustrated in FIG. 22, a plurality of the diffraction gratings arranged with a predetermined space to each other cause the beams having a certain wavelength to reflect and resonate so as to generate the laser oscillation. Also, the phase shifting region 15 is adapted for shifting the phase of the beam by λ/4 (λ: wavelength) The active layer 3 in cooperation with the cladding layers 2, 4 sandwiching thereof defines a beam waveguide, and an oscillation structure is realized between the front- and rear-end surfaces.

According to the conventional distributed-feedback semiconductor laser device 500, the photon density of the active layer 3 becomes greater with distance from both end surfaces toward the phase shifting region 15 adjacent to the middle point between both end surfaces. Thus, the carrier density is reduced in the region adjacent to the phase shifting region 15 (hole burning effect). The reduced carrier density causes the plasma effect of the carriers to be decreased, increasing the refractive index of the active layer 3. Because of this result, when the variation of the refractive index across the oscillator (active layer 3) is too broad, the transverse mode of the laser oscillation, influenced by the difference of refractive index between the core portion and the cladding portion of the beam waveguide, becomes unstable. Thus, the linearity between current and optical output is adversely affected and causes a so-called kink. Therefore, the conventional distributed-feedback semiconductor laser device has a drawback in that it cannot achieve a high optical performance because of the insufficient optical output and the kink.

Other types of semiconductor laser devices such as a Fabry-Perot semiconductor laser device and a partial diffraction gratings semiconductor laser device also have the similar drawbacks as well.

Therefore, one of the embodiments of the present invention has a purpose to provide a kink-free semiconductor optical device stabilizing a laser oscillation and obtaining a high optical performance.

SUMMARY OF THE INVENTION

One of the aspects of the present invention is to provide a semiconductor optical device including a beam waveguide extending in a longitudinal direction between a pair of end surfaces. The beam waveguide includes an active layer of a quantum well structure having at least one well and barrier layers, and a pair of cladding layers sandwiching the active layer. The active layer has a first and second regions in the longitudinal direction, formed so as to have a photon density in the first region greater than that of the second region. The first region has a differential gain greater than that of the second region so that a variation of refractive index across the beam waveguide is reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "right-side", and "left-side") are conveniently used just for clarity, it should not be interpreted that those terminology limit the scope of the present invention.

Embodiment 1.

Figure 1:
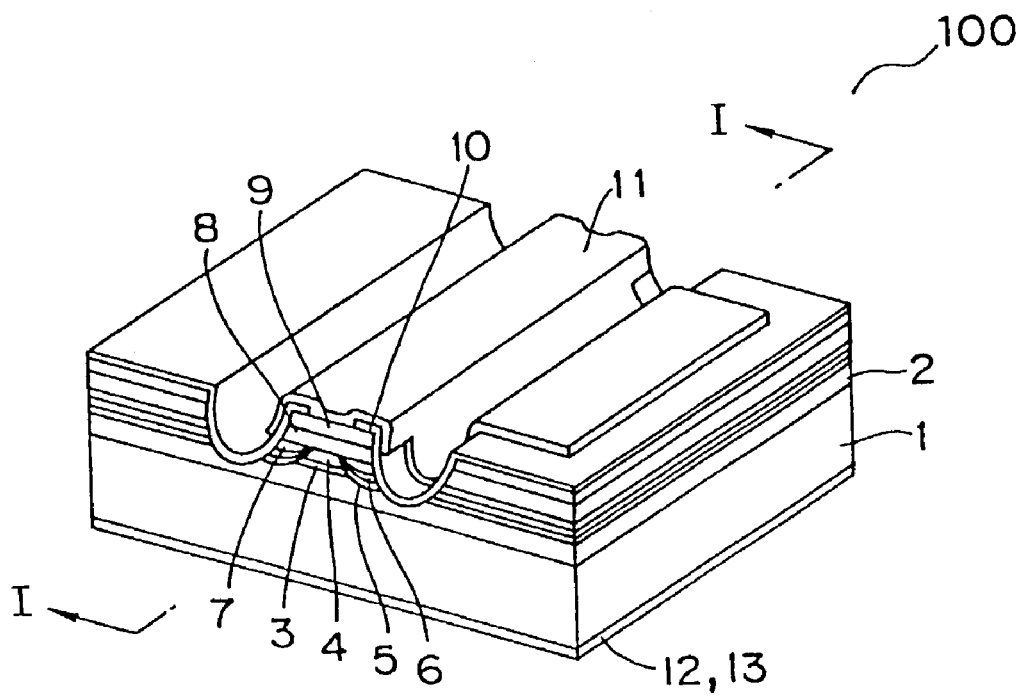
FIG. 1 is a perspective view of a distributed-feedback semiconductor laser device according to the first embodiment of the present invention.
Figure 2:
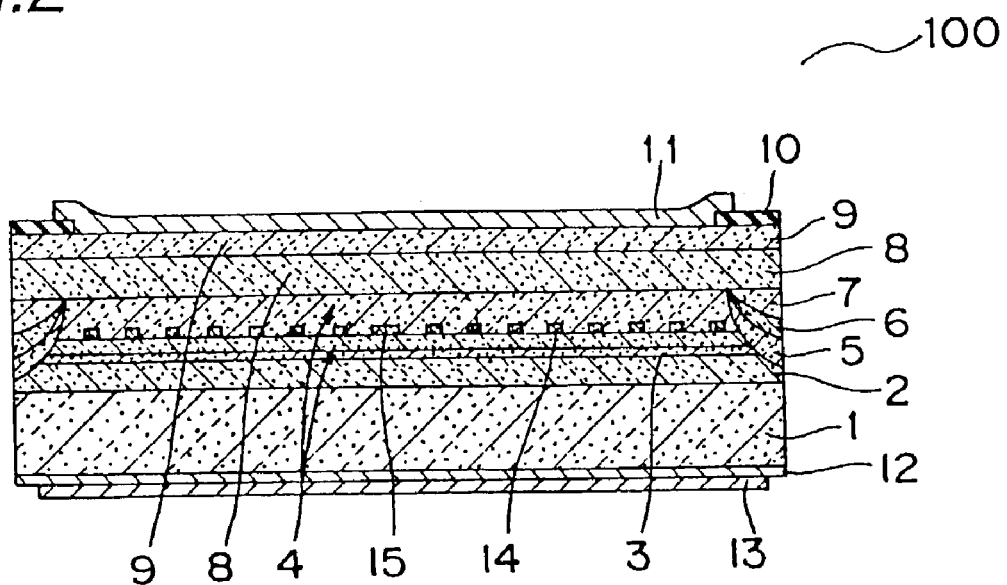
FIG. 2 is a cross sectional view, taken along the line II—II of FIG. 1, of the distributed-feedback semiconductor laser device according to the first embodiment of the present invention.

FIG. 1 is a perspective view of a λ/4-shifted distributed-feedback semiconductor laser device according to the first embodiment of the present invention. FIG. 2 is a cross sectional view taken along a line II—II of FIG. 1. In FIGS. 1 and 2, the same reference numerals denote the same elements.

With reference to FIGS. 1 and 2, in particular, the distributed-feedback semiconductor laser device 100 includes a substrate 1 of p-InP, on which a buffer layer (or first cladding layer) 2 of p-InP is formed. Formed on the buffer layer 2 is an active layer 3 formed as a multiple quantum well (MQW) layer of InGaAsP. The active layer 3 may be formed as a single quantum well (SWQ) layer. Also, provided on the active layer 3 are cladding layers 4, 8 of n-InP. The active layer 3 is sandwiched between the buffer layer 2 and the cladding layer 4.

Further, grown adjacent to both end surfaces are blocking layers 5, 7 of p-InP and a blocking layer 6 of n-InP sandwiched therebetween.

A contact layer 9 of n-InGaAs, an insulating layer 10 of silicon dioxide, and a cathode electrode 11 of Ti/Au are formed subsequently on the cladding layer 8. Also, formed on the bottom surface of the substrate 1 are anode electrodes 12, 13 of AuZn/Au/Ti/Pt/Ti/Pt/Au.

In addition, a beam guiding layer 14 of InGaAsP are embedded within the cladding layer 4, performing a function as diffraction gratings. A phase shifting region 15 of the diffraction gratings is provided adjacent to a middle point positioned between both end surfaces.

In the distributed-feedback semiconductor laser device 100, as illustrated in FIG. 2, a plurality of the diffraction gratings arranged with a predetermined space to each other cause beams having a certain wavelength to reflect and resonate so as to generate the laser oscillation. Also, the phase shifting region 15 is adapted for shifting the phase of the beam by λ/4 (λ: wavelength). The active layer 3 in cooperation with the cladding layers 2, 4 sandwiching thereof defines a beam waveguide, and an oscillation structure is realized between the front- and rear-end surfaces.

The active layer of the distributed-feedback semiconductor laser device has the photon density distribution, in general, which has an increased value in a region (first region) adjacent to the middle point positioned between both end surfaces (front- and rear-end surfaces). Thus, the photon density in the first region of the active layer is greater than that in the other region (second region) adjacent to both end surfaces.

The active layer 3 of the distributed-feedback semiconductor laser device 100 according to the present embodiment is designed so that the first region of the active layer 3 where the photon density is increased has a differential gain greater than that in the second region adjacent to both end surfaces. The differential gain is defined as an increasing rate of the gain over the increased carrier density. To this result, the distributed-feedback semiconductor laser device 100 according to the present embodiment can reduce a variation (maximum-minimum range) of the refractive index across the beam waveguide.

Figure 3:
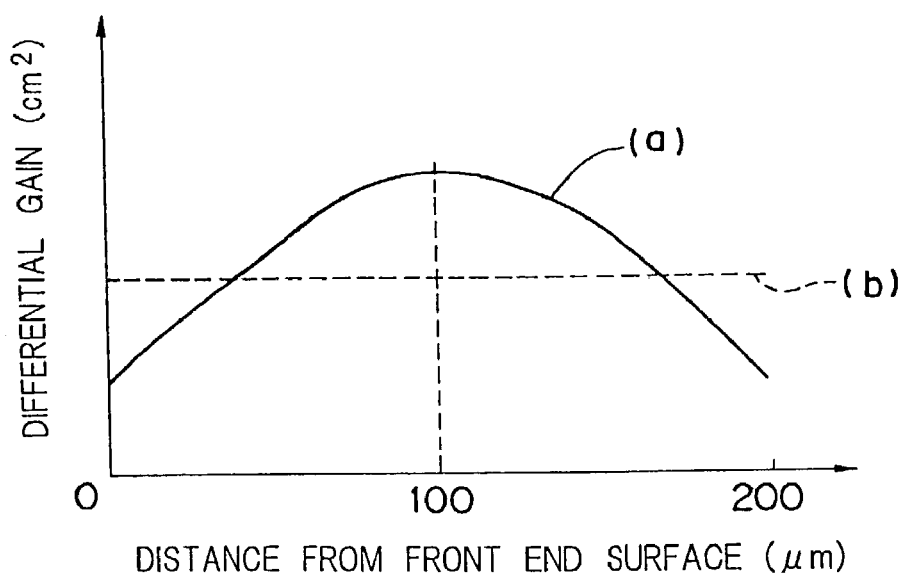
FIG. 3 is a graph illustrating the differential gain distribution for the distance from the front-end surface of the distributed-feedback semiconductor laser device.

In particular, details will be described hereinafter with reference to further drawings. FIG. 3 is a graph illustrating the differential gain distribution for the distance from the front-end surface of the distributed-feedback semiconductor laser device, in which the solid and dashed lines (a), (b) show the differential gains of the present embodiment and the prior art device, respectively. The distributed-feedback semiconductor laser device of the present embodiment and the prior art device have the same total distance between the both end surfaces, which are 200 microns. Also, the denotations (a), (b) are also used in FIGS. 4 to 8 to indicate other distributions of the present invention and the prior art, respectively.

As clearly shown by the solid line (a) in FIG. 3, according to the distributed-feedback semiconductor laser device 100 of the present embodiment, the active layer 3 has the differential gain distribution with a peak or increased value in the (first) region provided adjacent to the middle point between both end surfaces and near the phase shifting region 15 of the beam guiding layer 14. In other words, the differential gain of the active layer 3 of the present embodiment is greater in the first region where the photon density is greater than that in the second region adjacent to both end surfaces. Meanwhile, the differential gain of the active layer 3 of the prior art device is almost constant across the active layer 3.

Figure 4:
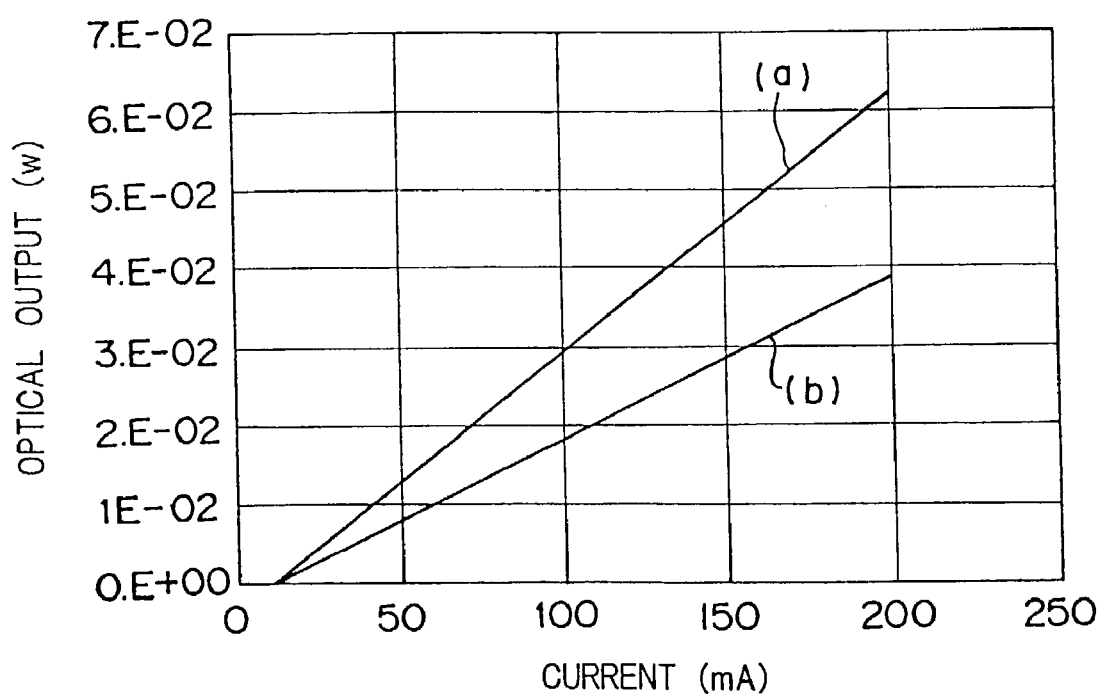
FIG. 4 is a graph illustrating the relationship between current and optical output when forward voltage is applied to the distributed-feedback semiconductor laser device.

FIG. 4 is a graph showing the relationship between current and optical output when a forward voltage is applied to the distributed-feedback semiconductor laser devices. As shown, the distributed-feedback semiconductor laser device of the present embodiment has an improved optical performance with an emission efficiency (a) greater than that of the prior art device (b).

Figure 5:
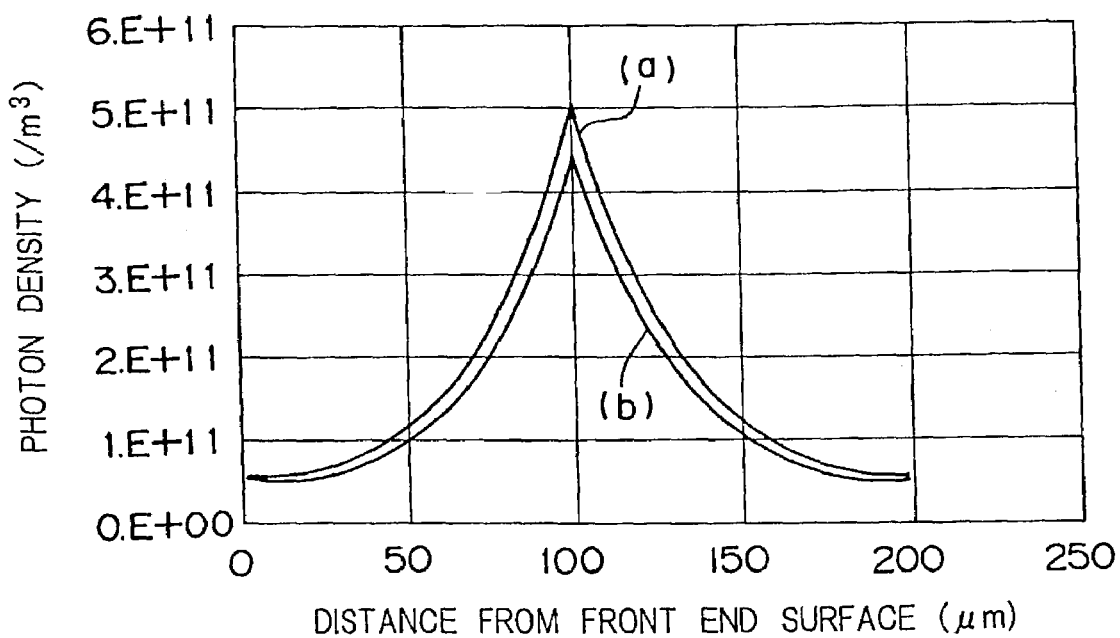
FIG. 5 is a graph illustrating the photon density distribution within the oscillator (active layer) for the distance from the front-end surface of the distributed-feedback semiconductor laser device.

FIG. 5 is a graph illustrating the photon density distribution within the oscillator (active layer 3) for the distance from the front-end surface of the distributed-feedback semiconductor laser device. The transverse and vertical axes of FIG. 5 represent a distance from the front-end surface and the photon density, respectively. The point at 100 microns from the front-end surface is the middle point where the phase shifting region 15 is formed. The photon density distribution of the distributed-feedback semiconductor laser device of the present embodiment (a) has a graphical configuration similar to that of the prior art device (b), having the peak adjacent to the middle point between both end surfaces.

Thus, the carrier density is reduced due to a stimulated emission more significantly in the first region adjacent to the middle point rather than the other regions, i.e., the second region adjacent to both end surfaces.

Figure 6:
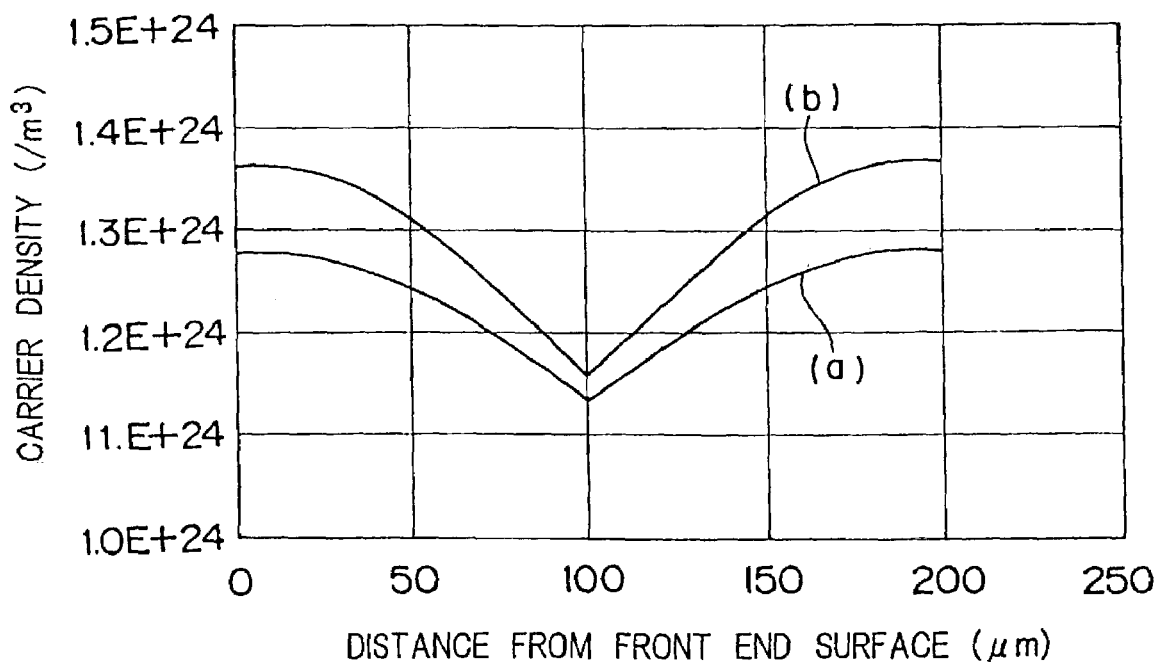
FIG. 6 is a graph illustrating the carrier density distribution within oscillator (active layer) with respect to distance from the front-end surface of the distributed-feedback semiconductor laser device.

FIG. 6 is a graph illustrating the carrier density distribution within the oscillator (active layer 3) for the distance from the front-end surface of the distributed-feedback semiconductor laser devices. The transverse and vertical axes of FIG. 6 represent a distance from the front-end surface and the carrier density, respectively. The carrier density distribution of the distributed-feedback semiconductor laser devices, in general, has the minimum value adjacent to the middle point between both end surfaces because of the stimulated emission, and the maximum value adjacent to both end surfaces. Thus, a variation (or a maximum-minimum range) of the carrier density within the oscillator (active layer 3) can be defined to represent the difference or gap between the maximum and the minimum values of the carrier density along the traverse axis (along a waveguide or longitudinal direction).

However, since the oscillator (active layer 3) of the present embodiment has the differential gain as illustrated in FIG. 3, it has the variation of the carrier density less than that of the conventional oscillator.

Figure 7:
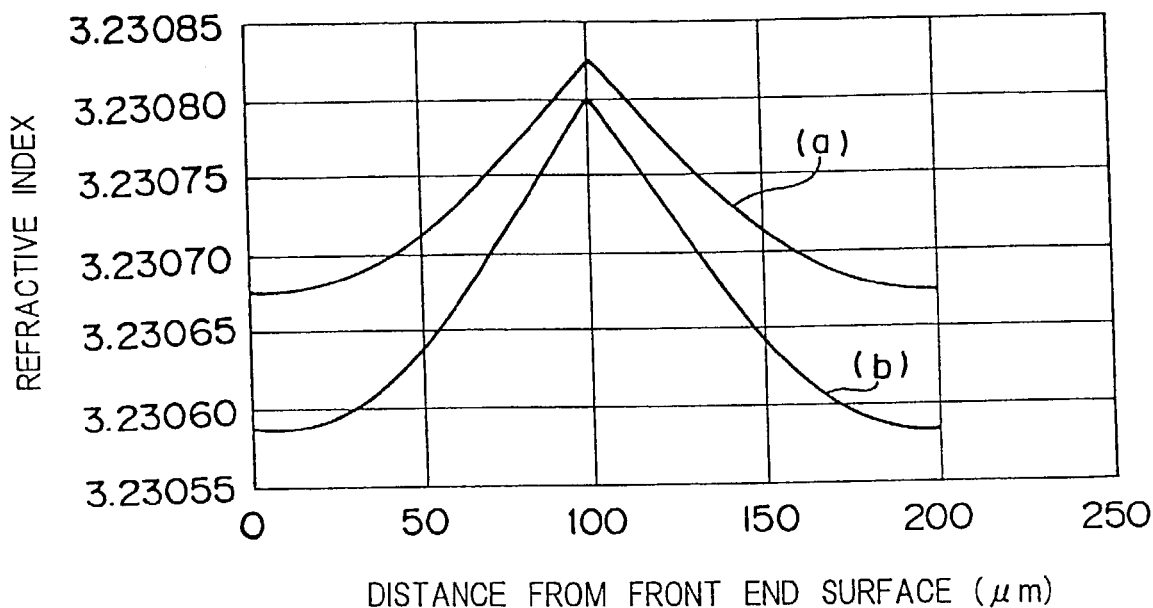
FIG. 7 is a graph illustrating refractive index distribution within the oscillator (active layer) for the with respect to distance from the front-end surface of the distributed-feedback semiconductor laser device.

FIG. 7 is a graph illustrating the refractive index distribution within the oscillator (active layer 3) for the distance from the front-end surface of the distributed-feedback semiconductor laser device. The transverse and vertical axes of FIG. 7 represent a distance from the front-end surface and the refractive index, respectively. Also, a variation of the refractive index within the oscillator (active layer 3) can be defined to represent the difference or gap between the maximum and the minimum values of the refractive index along the traverse axis (along a waveguide or longitudinal direction).

As above, the variation of carrier density of the present embodiment is less than that of the conventional one as shown in FIG. 6. Therefore, as shown in FIG. 7, the distributed-feedback semiconductor laser device 100 has the variation of the refractive index (a), which is also less than that (b) of the conventional distributed-feedback semiconductor laser device.

According to the present embodiment, the variation (maximum-minimum range) of the refractive index within the oscillator (active layer 3) can be reduced in comparison with that of the conventional one. Thus, the variation of the refractive index between the core portion (active layer 3) and cladding portion (the cladding layers 2, 4) of the beam waveguide can also be reduced. This realizes the kink-free distributed-feedback semiconductor laser device 100 with a stable transverse mode and the improved optical performance as shown in FIG. 4.

A variety of examples of the distributed-feedback semiconductor laser device 100 will be described hereinafter, with the reduced variation of the refractive index across the beam waveguide for the improved optical performance.

EXAMPLE 1

In the first example of the present embodiment, the distributed-feedback semiconductor laser device 100 shown FIGS. 1 and 2 is designed so that a plurality: of quantum well layers of the active layer 3 has thickness modified to be thinner in the regions adjacent to the middle point than both end surfaces. Thus, the differential gain is increased in the region adjacent to the middle point between both end surfaces so that the variation of the refractive index across the beam waveguide is reduced.

Figure 8:
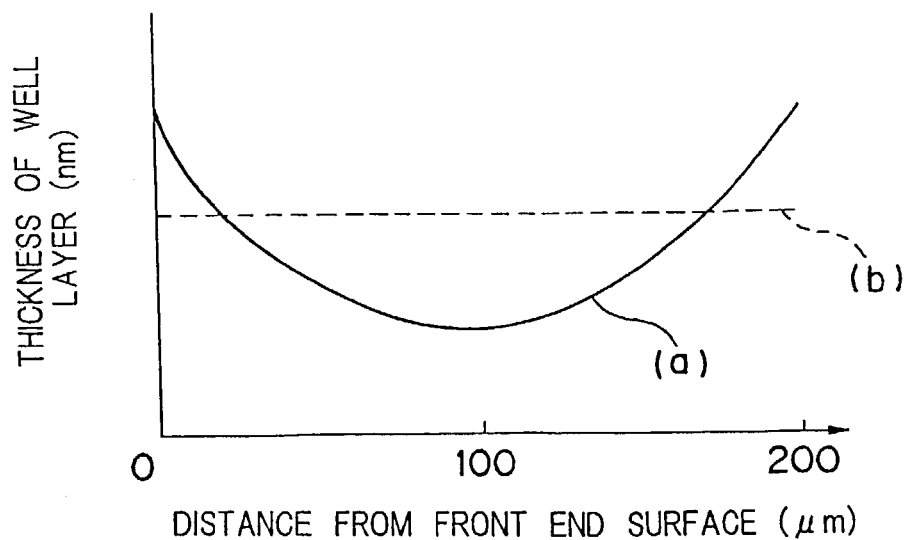
FIG. 8 is a graph illustrating thickness of the well layer with respect to distance from the front-end surface of the distributed-feedback semiconductor laser device.

FIG. 8 is a graph illustrating the thickness of the well layer for the distance from the front-end surface of the distributed-feedback semiconductor laser device 100 according to the first example. The distributed-feedback semiconductor laser device 100 according to the first example has the well layer modified so that it gradually and continuously becomes thinner towards the middle point as shown by the solid line (a). Meanwhile, the conventional distributed-feedback semiconductor laser device has the well layer with the constant thickness as indicated by the dashed line (b).

Figure 9A:
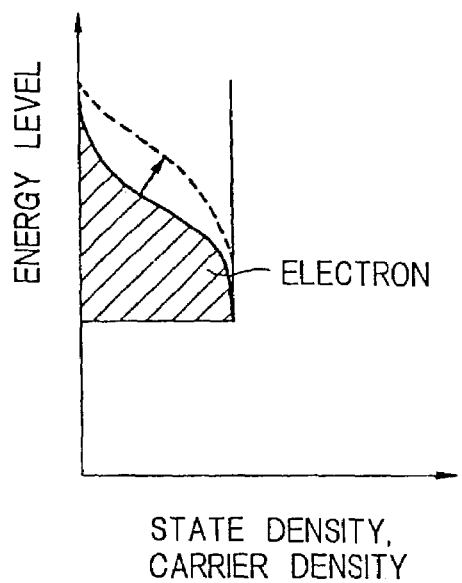
FIG. 9 is a graph illustrating relationships between state density, carrier density, and energy level.
Figure 9B:
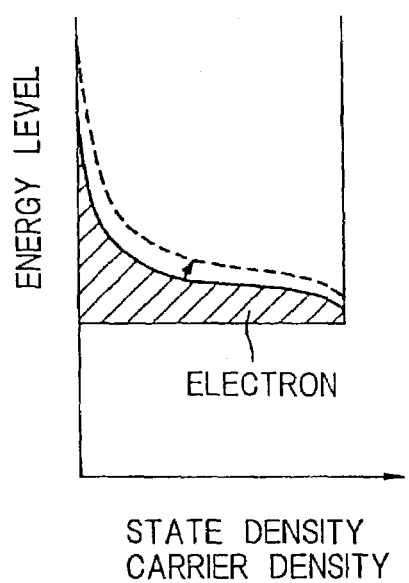

FIGS. 9A and 9B are graphs illustrating relationships between the state density and the carrier density, and the energy level. FIGS. 9A and 9B show such relationships in cases where the well layer of the active layer 3 is thin and thick, respectively.

When a certain amount of the carrier is injected into the well layer, the carrier density of electrons is increased in total as well as the carrier density having the energy level contributing to the laser oscillation (i.e., corresponding to the oscillation wavelength). The increase (change) of the carrier density corresponding to the oscillation wavelength when the well layer is thin (a) is much greater than that when the well layer is thick (b). The energy levels after increasing the carrier density are indicated by the dashed lines in FIGS. 9A and 9B.

The differential gain (dG/dN) and the carrier density satisfy the following relation.

$$(dG/dN) \propto I_{osc}/I_{total} \quad \text{(Equation 1)}$$

wherein $I_{total}$ represents the total change of the carrier density, while $I_{osc.}$ represents the change of the carrier density corresponding to the oscillation wavelength.

In the quantum well structure, as the well layer is thinner, the state density per energy level is less, thus the carrier density $I_{osc.}$ at the energy level corresponding to the oscillation wavelength is substantially changed with even a small increase of the total carrier density $I_{total}$.

The distributed-feedback semiconductor laser device 100 so constructed can achieve the desired optical performance with the improved differential gain as illustrated in FIG. 3.

It should be noted that although the thickness of the well layer is gradually and continuously modified in the first example, it may be modified in a stepped configuration to have the minimum thickness adjacent to the middle point.

Also, while the present embodiment of the invention is applied to the active layer 3 of the multiple quantum well layer, it can equally be incorporated into an active layer of a single quantum well layer (SQW).

Next, a process for fabricating the active layer 3 of the distributed-feedback semiconductor laser device 100 will be described hereinafter. The first process for manufacturing the active layer 3 utilizes a selective growth mask.

Figure 10:
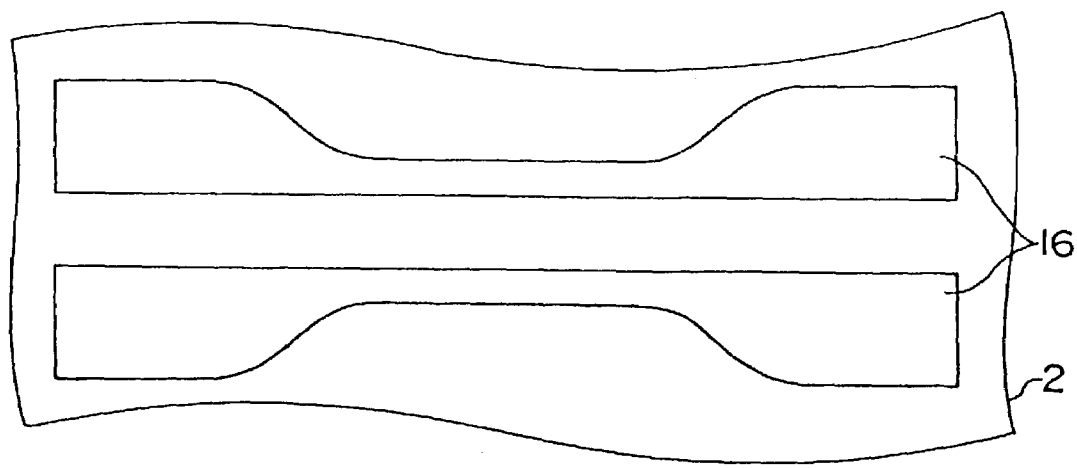
FIG. 10 is a top plan view of the uncompleted distributed-feedback semiconductor laser device.

FIG. 10 is a top plane view of the uncompleted distributed-feedback semiconductor laser device 100 after forming a pair of the selective growth masks 16 on the buffer layer 2 of InP, which is formed on the substrate 1 of InP. The selective growth masks 16 are formed of material such as silicon dioxide in a planar configuration shown in FIG. 10. The pair of the selective growth masks 16 extend along the beam waveguide direction, defining a gap or channel therebetween at the position corresponding to and beneath the active layer 3. Also, each of the selective growth masks 16 has a width narrower in the region adjacent to the middle point and wider in the region corresponding to both end surface, while the gap or channel therebetween has the constant width. As above, the active layer 3 is formed on the gap or channel sandwiched between the pair of the selective growth masks 16.

The active layer 3 so formed has a plurality of barrier layers and well layers having thickness thinner adjacent to the middle point and thicker at both end surfaces.

The second process for manufacturing the active layer 3 uses a butt-joint technique, in which some crystal growing steps and etching steps are alternately repeated to form the active layer 3.

Figure 11:
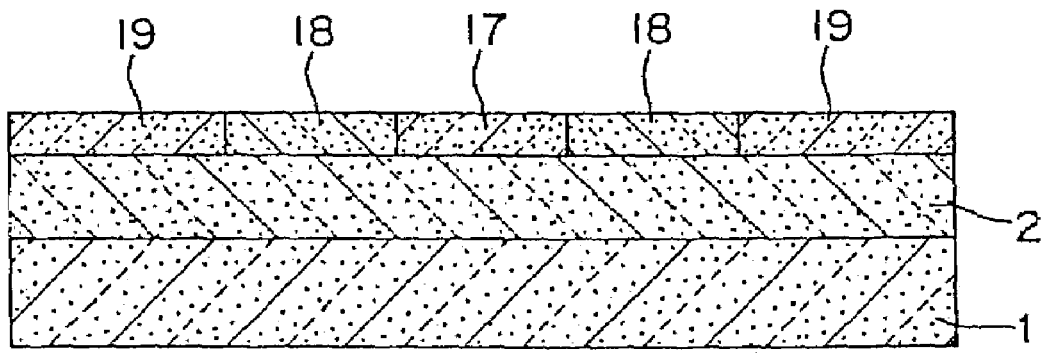
FIG. 11 is a cross sectional view of the uncompleted distributed-feedback semiconductor laser device.

FIG. 11 is a cross sectional view of the uncompleted distributed-feedback semiconductor laser device 100 after growing the active layers 17, 18, and 19 on the buffer layer 2, which are formed on the substrate 1. Each of the active layers 17, 18, and 19 has a plurality of well layers with thickness different from one another.

According to the but-joint technique, the first active layer is formed on and across the buffer layer 2 and then etched in the regions 18, 19 with use of a commonly used lithography and etchings process. The second active layer is formed in the regions 18, 19 with another mask on the active layer 17 also with use of the lithography and etchings process. Lastly, the third active layer is formed in the region 19 with another mask on the active layers 17, 18 also with use of the lithography and etchings process. The active layer 17 includes the largest number of the well and barrier layers which are the thinnest, while active layer 19 has the smallest number of the well and barrier layers which are the thickest. The active layer 18 has the medium number (i.e., between the largest and smallest numbers of the active layers 17 and 18) of the well and barrier layers which have the thickness between those of the active layers 17, 18.

It should be noted that those processes can also be used for fabricating the structure of Examples 2, 3, which will be described below.

EXAMPLE 2

In the distributed-feedback semiconductor laser device 100 of the second example, the oscillation wavelength is determined by the space of the adjacent diffraction gratings, while the maximum gain wavelength is defined by a composition material of the active layer 3. Therefore, a detuning wavelength can be defined herein as a difference between the oscillation wavelength and the maximum gain wavelength.

In the second example, the distributed-feedback semiconductor laser device 100 is designed so that the detuning wavelength thereof is increased in the first region adjacent to the middle point between both end surfaces where the photon density within the oscillator (active layer 3) is increased. To this end, the differential gain in the first region adjacent to the middle point between both end surfaces can be increased.

Figure 12:
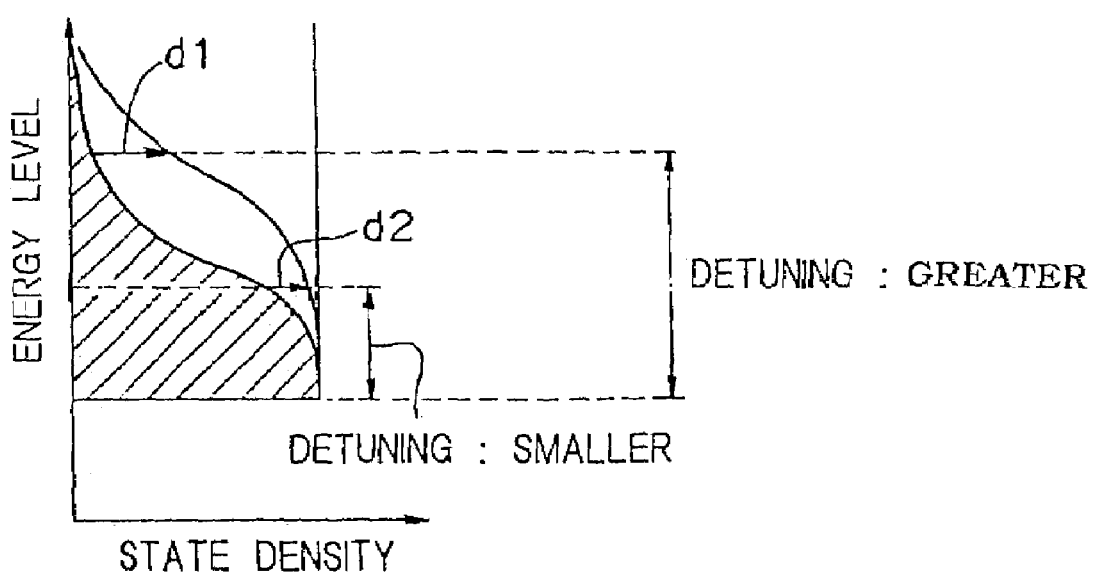
FIG. 12 is a graph illustrating relationship between state density and energy level.

FIG. 12 is a graph illustrating relationship between the state density and the energy level. Electrons are allowed to exist in the hatched region in FIG. 12. The relationship between the state density and the energy level of electrons and holes are determined by the Fermi function. As can be seen from FIG. 12, the increase of the gain over the increase of the carrier density at a predetermined oscillation wavelength, that is the differential gain, is more increased $(d_1 > d_2)$, as the detuning wavelength is greater.

In particular, the distributed-feedback semiconductor laser device 100 as shown in FIGS. 1 and 2 includes the active layer 3 having the well and barrier layers made of $In_{0.79}Ga_{0.21}As_{0.76}P_{0.24}/In_{0.74}Ga_{0.26}As_{0.57}P_{0.43}$, respectively, in the region adjacent to the middle point between both end surfaces. Also, the well and barrier layers of the active layer 3 is composed of $In_{0.80}Ga_{0.20}As_{0.74}P_{0.26}/In_{0.74}Ga_{0.26}As_{0.57}P_{0.43}$, respectively, in the region adjacent to both end surfaces.

In the active layer 3 so formed, the well layer of the active layer 3 has the composition wavelengths of 1670 nm and 1660 nm in the regions adjacent to the middle point and both end surfaces, respectively. If the oscillation wavelength is 1550 nm, for example, the detuning wavelength is 120 nm in the region adjacent to the middle point while it is 110 nm in the region adjacent to both end surfaces. The difference of the detuning wavelength between in the regions adjacent to the middle point and both end surface is 10 nm. Thus, the active layer is composed of material selected so that the detuning wavelength of the active layer in the first region is greater than that in the second region.

It should be noted that although two different composition materials are used for forming the active layer 3 in the region adjacent to the middle point and in the other regions, three or more composition materials may be used. Also, the composition ratio of the active layer 3 may gradually and continuously be modified.

EXAMPLE 3

In the distributed-feedback semiconductor laser device 100 of the third example, the active layer 3 includes a plurality of well layers having compressive strain, which is greater in the first region adjacent to the middle point between both end surfaces than that in the second region adjacent to both end surfaces.

In the active layer 3, the state density per energy level is less, as the effective mass is less. Meanwhile, the effective mass is less, as the compressive strain of the well layer is greater.

Therefore, according to the distributed-feedback semiconductor laser device 100 of the third example, the compressive strain of the well layer adjacent to the middle point between both end surfaces is increased to reduce the effective mass in the region adjacent to the middle point so that the state density per energy level can be reduced. To this result, a substantial optical gain in the region adjacent to the middle point is obtained with a small increase of the carrier density, thus the improved differential gain is achieved.

In particular, the distributed-feedback semiconductor laser device 100 of the third example includes the active layer 3 having the well and barrier layers made of $In_{0.80}Ga_{0.20}As_{0.74}P_{0.26}/In_{0.74}Ga_{0.26}As_{0.57}P_{0.43}$, respectively, in the region adjacent to the middle point between both end surfaces. Also, the well and barrier layers of the active layer 3 is composed of $In_{0.68}Ga_{0.32}As_{0.85}P_{0.15}/In_{0.74}Ga_{0.26}As_{0.57}P_{0.43}$, respectively, in the region adjacent to both end surfaces.

In the active layer 3 so formed, the well layer has the compressive strains of 1.0% and 0.5% in the first and second regions adjacent to the middle point and both end surfaces, respectively.

It should be noted that although two different composition materials are used for forming the active layer 3 in the region adjacent to the middle point and in the other region, three or more composition materials may be used. Also, the composition ratio of the active layer 3 may gradually and continuously be modified.

EXAMPLE 4

Figure 13:
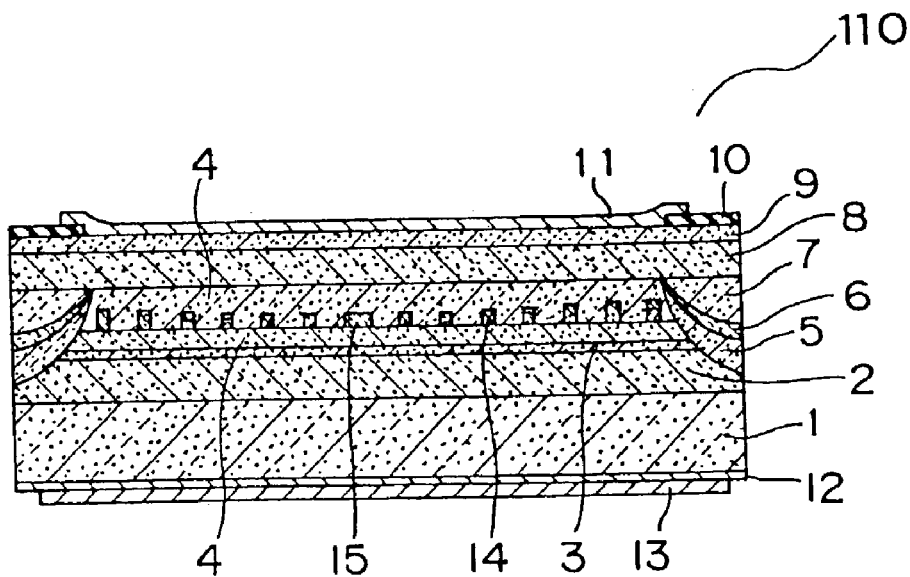
FIG. 13 is a cross sectional view of another distributed-feedback semiconductor laser device.

FIG. 13 is a cross sectional view of the distributed-feedback semiconductor laser device 110 of the fourth example, taken along a line like line II—II of FIG. 1. The same reference numerals in FIG. 13 denote the same elements in FIGS. 1 and 2.

The distributed-feedback semiconductor laser device 110 is structured so that the thickness of the well layer is reduced to increase the differential gain in the region of the active layer 3 where the photon density is greater, i.e., the first region adjacent to the middle point. In addition to that, the distributed-feedback semiconductor laser device 110 of the present example is designed so that the thickness (the vertical height in FIG. 13) of the beam guiding layer 14 is reduced in the region adjacent to the middle point. Thus, as illustrated in FIG. 13, a plurality of the beam guiding layers 14 arranged with a substantially constant space have the thickness which become thinner, as each of the beam guiding layers 14 is closer to the phase shifting region 15.

If the thickness of the well layer is reduced in the region where the photon density is greater, the beam confinement within the active layer 3 in that region is also reduced. To this end, the beam is confined more significantly in the portion where the diffraction gratings 14 are arranged rather than in the other portions, thus, the coupling coefficient of the diffraction gratings varies within the oscillator.

To compensate the variation of the coupling coefficient, the distributed-feedback semiconductor laser device 110 of the fourth example has the beam guiding layer (the diffraction gratings) 15 with thickness modified so that the coupling coefficient of the diffraction gratings is kept substantially constant across the oscillator.

EXAMPLE 5

The distributed-feedback semiconductor laser device of the fifth example includes the active layer 3 having an increased number of well layers with a reduced thickness in the region adjacent to the middle portion between both end surfaces where the photon density is greater.

Figure 14:
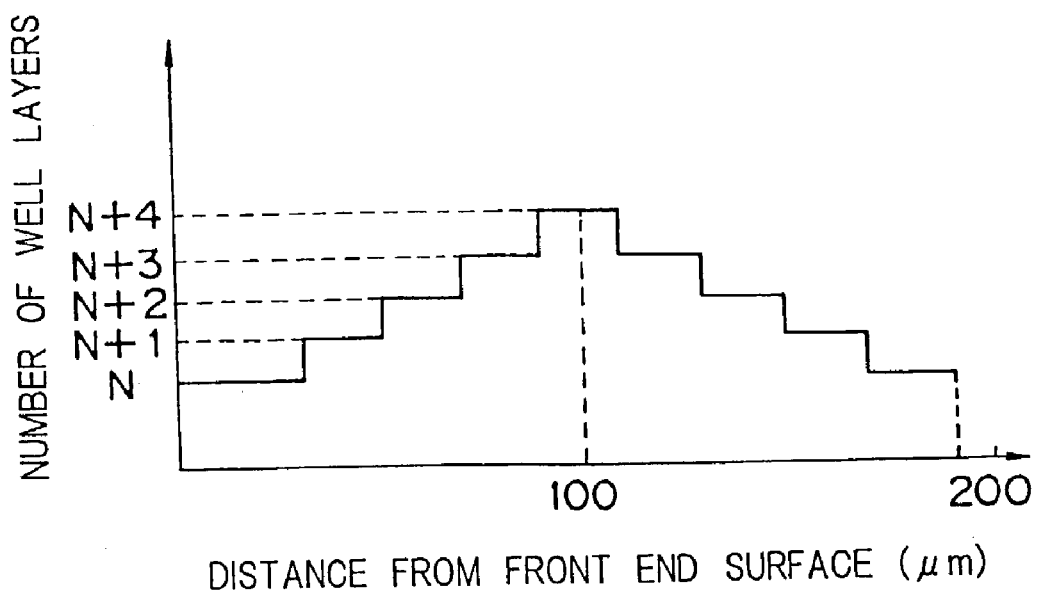
FIG. 14 is a chart showing the relationship between the distance from the front-end surface and the number of the well layers formed within the active layer.

FIG. 14 is a chart showing the relationship between the distance from the front-end surface and the number of the well layers formed within the active layer 3. As shown, the well layers are designed to increase the forming number within the active layer 3 from the front- and rear-end surfaces towards the middle point. The active layer 3 so designed may be manufactured with the butt-joint technique.

The increased number of well layers in the region adjacent to the middle point improves the beam confinement effect within the active layer 3, thus to keep the coupling coefficient of the diffraction gratings substantially constant across the oscillator.

Although the aforementioned embodiment and various examples are described with respect to the λ/4-shifted distributed-feedback semiconductor laser device, they can be adapted to any semiconductor optical devices with the oscillation wavelength determined by an external oscillator such as a module device combining a semiconductor optical amplifier and a fiber grating, and also a semiconductor optical amplifier, of which wavelength used therein is determined by an external system.

Embodiment 2.

Figure 15:
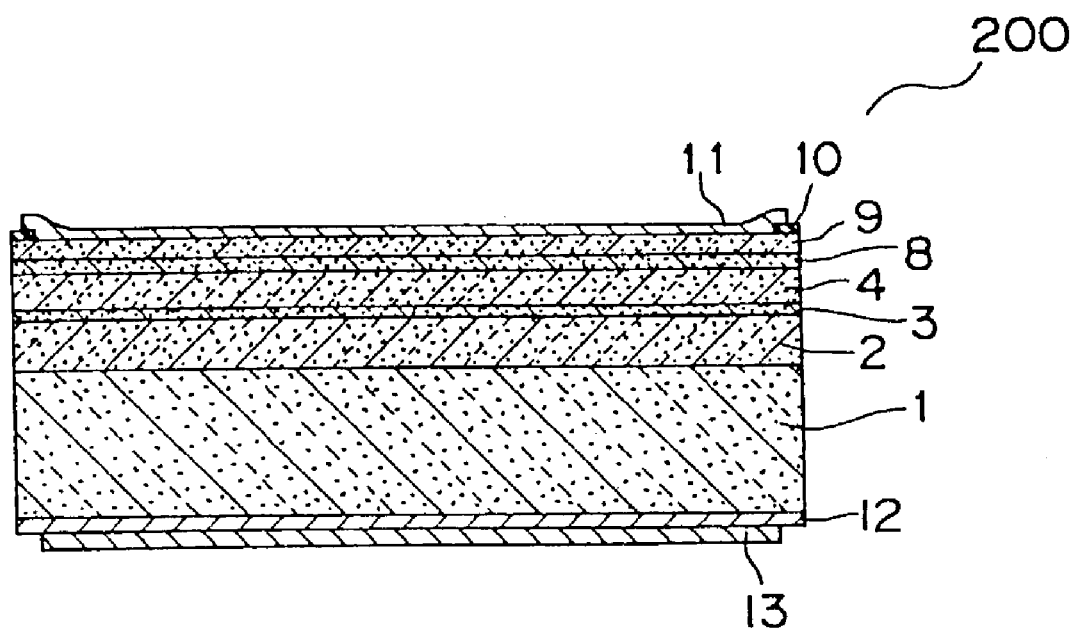
FIG. 15 is a cross sectional view, of a Fabry-Perot semiconductor laser device according to the second embodiment.

FIG. 15 is a cross sectional view, taken along a line like line II—II of FIG. 1, of a Fabry-Perot semiconductor laser device according to the present embodiment, which is denoted by a reference numeral 200. The same reference numerals in FIG. 15 denote the same elements in FIGS. 1 and 2.

In FIG. 15, the left-side and right-side end surfaces are the front- and rear-end surfaces, respectively. The beam waveguide includes the cladding layers 2, 4 of InP and the active layer 3 sandwiched by the cladding layers, and the oscillator structure is formed between the front- and rear-end surfaces.

Figure 16A:
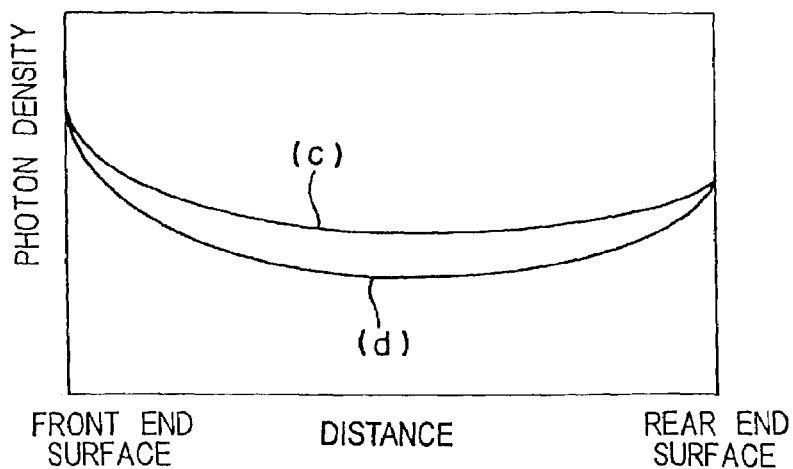
FIGS. 16A, 16B, and 16C are graphs illustrating photon density distribution, carrier density distribution, and refractive index distribution, respectively, with respect to distance from the front-end surface of the Fabry-Perot semiconductor laser device.
Figure 16B:
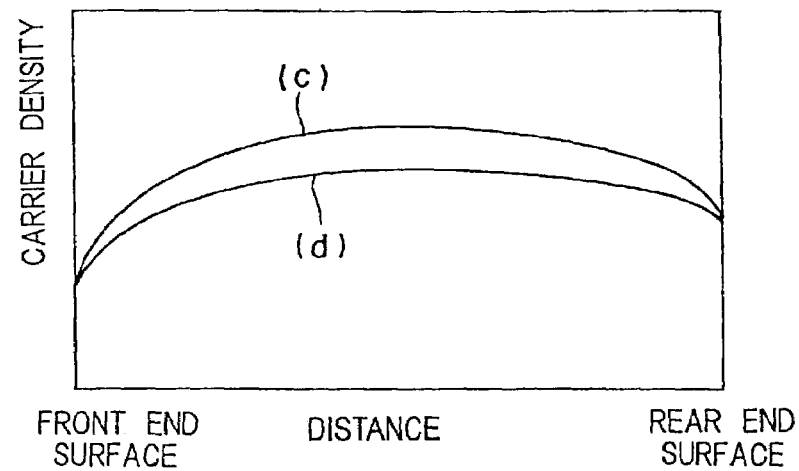
Figure 16C:
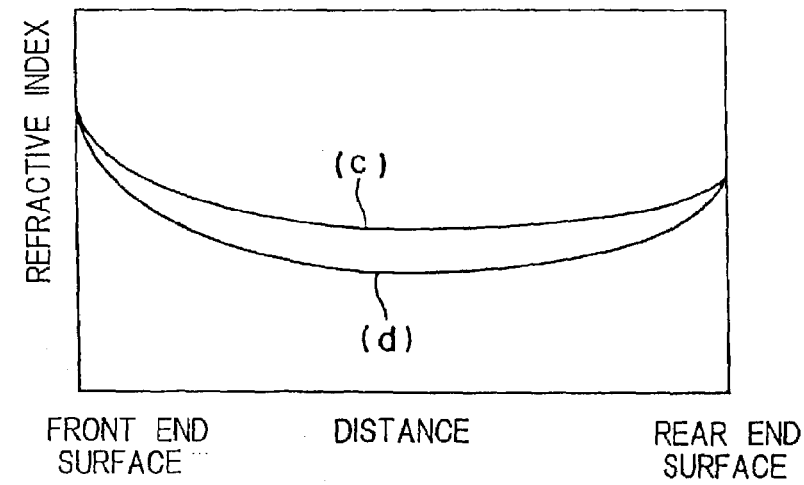

FIGS. 16A, 16B, and 16C are graphs illustrating distributions of the photon density, the carrier density, and the refractive index, respectively, within the oscillator (active layer 3) of the Fabry-Perot semiconductor laser device. The reference numerals (c) and (d) indicate the distributions of the Fabry-Perot semiconductor laser device according to the present embodiment and prior art device, respectively.

Contrary to the first embodiment, the oscillator (active layer 3) of the Fabry-Perot semiconductor laser device of the present embodiment has, in general, the photon density higher in the first region adjacent to the front-end surface than that in the second region adjacent to the middle point between both end surfaces (FIG. 16A). Thus, the carrier density is reduced in the region adjacent to the front-end surface rather than that in the region adjacent to the middle point (FIG. 16B), and accordingly, the plasma effect of the carrier is reduced in the region adjacent to the front-end surface as well. To this end, the refractive index is increased in the region adjacent to the front-end surface rather than that in the region adjacent to the middle point (FIG. 16C). This reduces the optical output and gives an adverse impact on the high power output of the oscillator.

To address this drawback, the Fabry-Perot semiconductor laser device according to the present embodiment is structured so that the oscillator (active layer 3) has the differential gain greater in the first region adjacent to the front-end surface where the photon density is greater than the region adjacent to the middle point. To this end, the variation (maximum-minimum range) of the refractive index within the oscillator (active layer 3) can be reduced.

In particular, the Fabry-Perot semiconductor laser device 200 according to the present embodiment includes similar structures described with respect to Examples 1–3 of the first embodiment.

In the first structure of the Fabry-Perot semiconductor laser device 200, a plurality of quantum well layers of the active layer 3 has thickness modified to be thinner in the region adjacent to the front-end surface than in the other region of the active layer 3.

In the second structure of the Fabry-Perot semiconductor laser device 200, the detuning wavelength is increased in the region adjacent to the front-end surface than in the other region of the active layer 3.

In the third structure of the Fabry-Perot semiconductor laser device 200, the compressive strain of the well layer is increased in the region adjacent to the front-end surface than in the other region of the active layer 3.

The above-mentioned structures can be realized by the processes similar to those used for manufacturing the devices described in the examples of the first embodiment.

Therefore, the Fabry-Perot semiconductor laser device 200 of the present embodiment has the reduced variation of the refractive index between the core portion and the cladding portion of the beam waveguide. Also, since the stimulated emission reduces the carrier density in the region where the photon density is greater, a photoelectrical transferring efficiency is improved. This realizes a kink-free Fabry-Perot semiconductor laser device stabilizing a laser oscillation and obtaining a high optical performance.

Embodiment 3.

Figure 17:
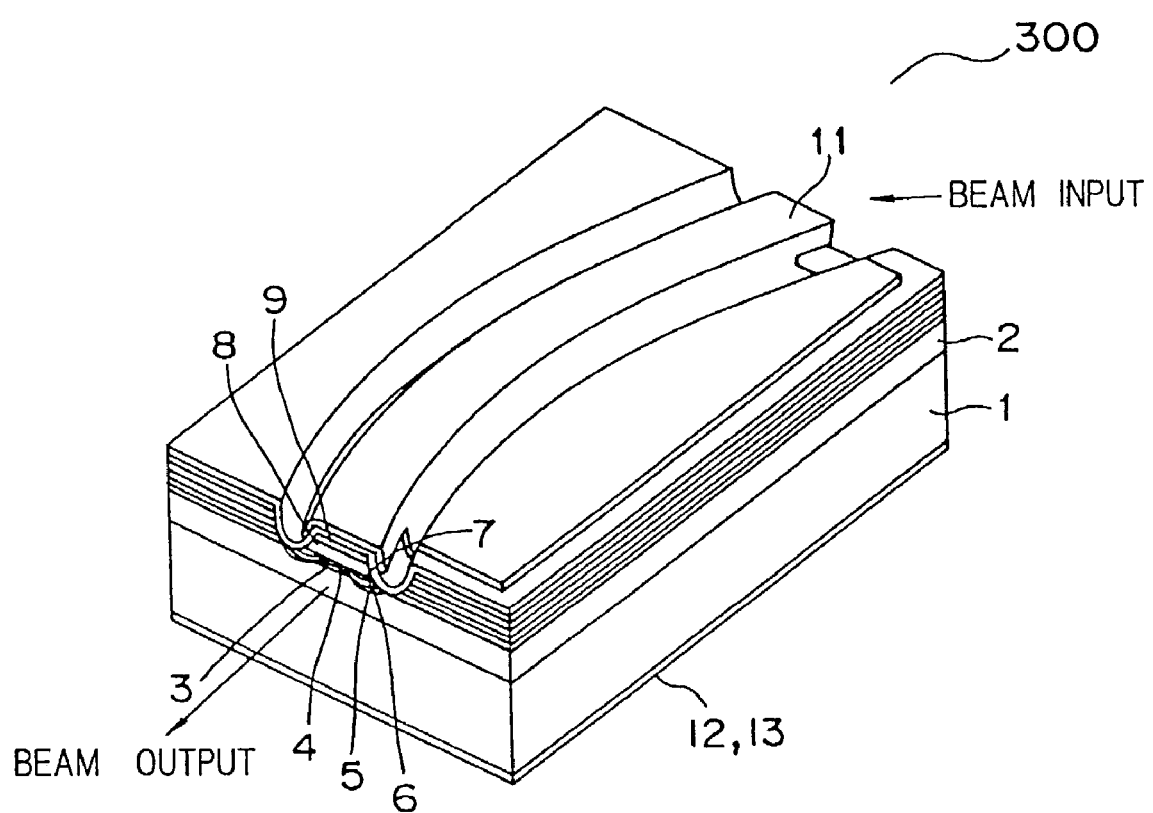
FIG. 17 is a perspective view of a traveling-wave semiconductor optical amplifier of the present embodiment

FIG. 17 is a perspective view of a traveling-wave semiconductor optical amplifier of the present embodiment, which is denoted by reference numeral 300. The same reference numerals in FIG. 17 denote the same elements in FIGS. 1 and 2.

In FIG. 17, the left-side end surface is an output end surface (front-end surface) and the right-side end surface is an input end surface (rear-end surface). The traveling-wave semiconductor optical amplifier 300 includes the beam waveguide having a pair of the cladding layers 2, 4 and the active layer 3, in which the beam received at the input end surface is amplified and then emitted from the output end surface. According to the traveling-wave semiconductor optical amplifier 300 of the present embodiment, the beam waveguide is curved so that the beam guided direction is not aligned perpendicularly to the output and input end surfaces, thereby reducing the reflection rates at those end surfaces. The traveling-wave semiconductor optical amplifier 300 of the present embodiment has the structure similar to that of the Fabry-Perot semiconductor laser device 200 of the second embodiment except that the beam waveguide is curved.

Figure 18A:
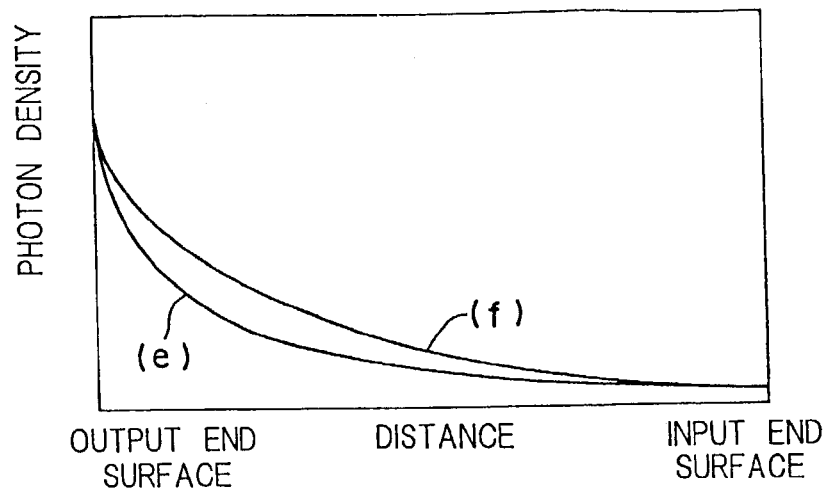
FIGS. 18A, 18B, and 18C are graphs illustrating photon density distribution, carrier density distribution, and refractive index distribution, respectively, with respect to distance from the front-end surface of the traveling-wave semiconductor optical amplifier.
Figure 18B:
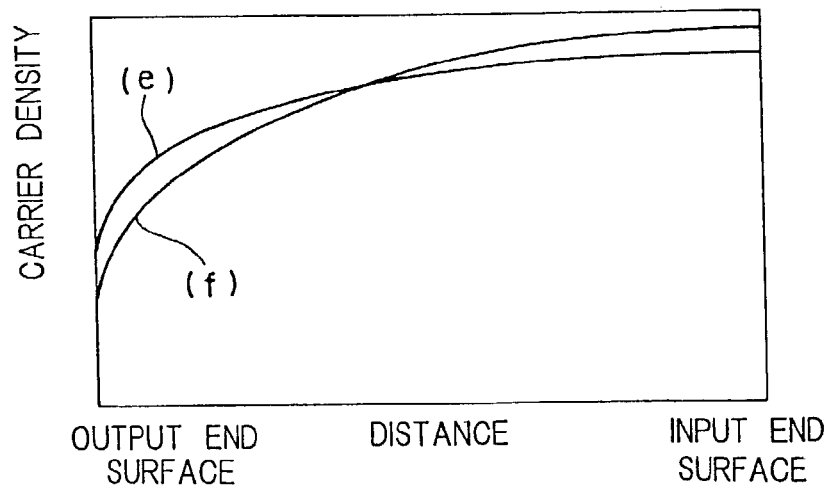
Figure 18C:
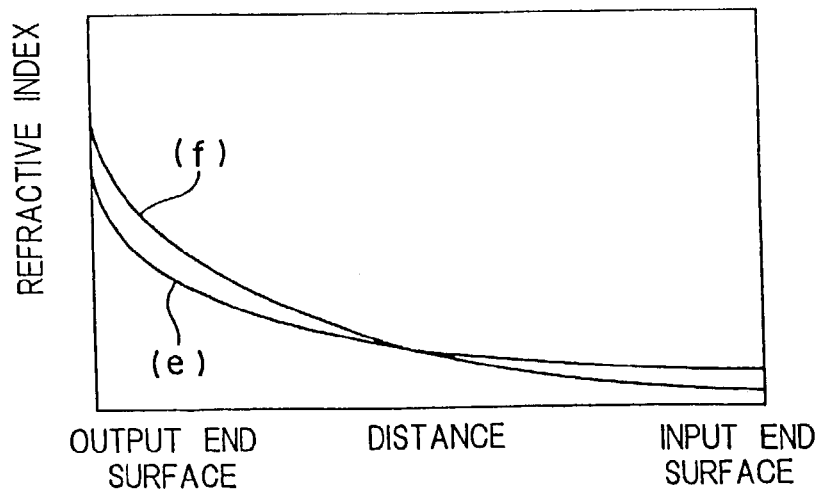

FIGS. 18A, 18B, and 18C are graphs illustrating distributions of the photon density, the carrier density, and the refractive index, respectively, within the oscillator of the traveling-wave semiconductor optical amplifier. The reference numerals (e) and (f) indicate the distributions of the traveling-wave semiconductor optical amplifier 300 according to the present embodiment and prior art device, respectively.

Again, unlike the first and second embodiments, the oscillator (active layer 3) of the traveling-wave semiconductor optical amplifier has, in general, the photon density higher in the first region adjacent to the output end surface than that in the second region adjacent to the input end surface (FIG. 18A). Thus, the carrier density is reduced in the region adjacent to the output end surface rather than that in the region adjacent to the input end surface (FIG. 18B), and accordingly, the plasma effect of the carrier is reduced in the region adjacent to the output end surface as well. To this end, the refractive index is increased in the region adjacent to the output end surface rather than that in the region adjacent to the input end surface. (FIG. 18C). This reduces the optical output and gives an adverse impact on the high power output of the oscillator.

To address this drawback, the traveling-wave semiconductor optical amplifier 300 according to the present embodiment is structured so that the oscillator (active layer 3) has the differential gain greater in the region adjacent the output end surface where the photon density is greater than the region adjacent to the input end surface so that the variation of the refractive index within the oscillator (active layer) is reduced.

In particular, the traveling-wave semiconductor optical amplifier 300 according to the present embodiment includes similar structures described with respect to Examples 1–3 of the first embodiment.

In the first structure of the traveling-wave semiconductor optical amplifier 300, a plurality of quantum well layers of the active layer 3 has thickness modified to be thinner in the region adjacent to the output end surface than that in the region adjacent to the input end surface of the active layer 3.

In the second structure of the traveling-wave semiconductor optical amplifier 300, the detuning wavelength thereof is increased in the region adjacent to the output end surface than that in the region adjacent to the input end surface of the active layer 3.

In the third structure of the traveling-wave semiconductor optical amplifier 300, the compressive strain of the well layer is increased in the region adjacent to the front-end surface than that in the region adjacent to the input end surface of the active layer 3.

The above-mentioned structures can be realized by the processes similar to those used for manufacturing the devices described in the examples of the first embodiment.

Therefore, the traveling-wave semiconductor optical amplifier 300 of the present embodiment has the variation of the refractive index between the core portion and the cladding portion of the beam waveguide. Also, since the stimulated emission reduces the carrier density in the region where the photon density is greater, a photoelectrical transferring efficiency is improved. This realizes a kink-free Fabry-Perot semiconductor laser device stabilizing a laser oscillation and obtaining a high optical performance.

Embodiment 4.

Figure 19:
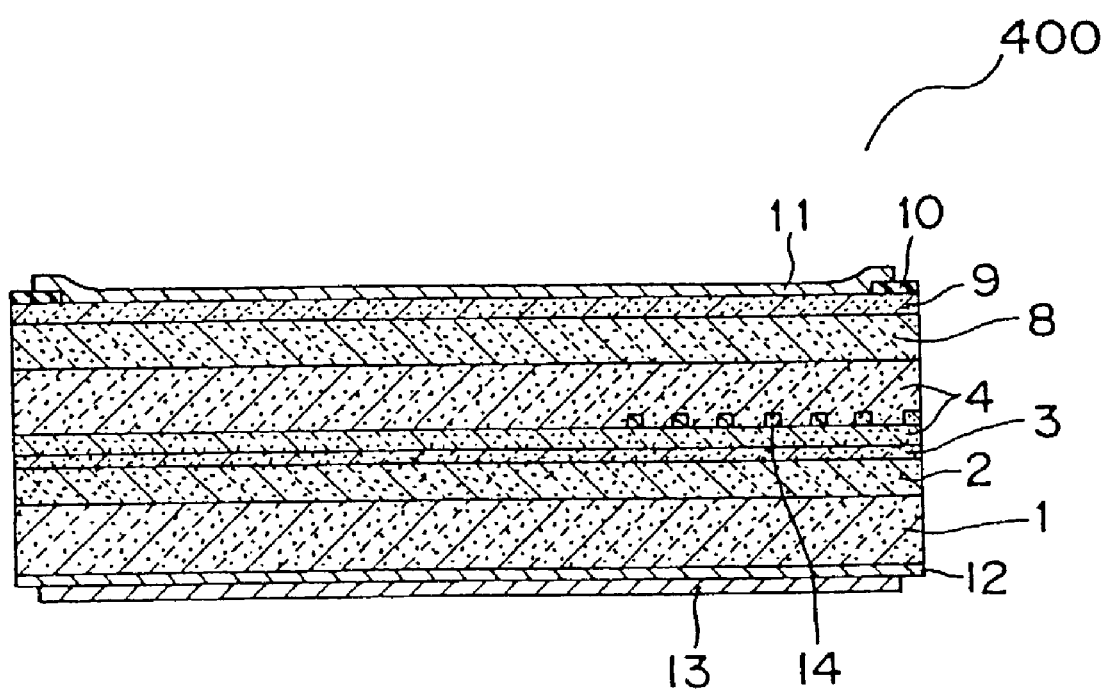
FIG. 19 is a cross sectional view, of a partial diffraction grading semiconductor laser device according to the third embodiment.

FIG. 19 is a cross sectional view, taken along a line like line II—II of FIG. 1, of a partial diffraction grading semiconductor laser device according to the present embodiment, which is denoted by a reference numeral 400. The same reference numerals in FIG. 19 denote the same elements in FIGS. 1 and 2.

In FIG. 19, the left-side and right-side end surfaces are the front- and rear-end surfaces, respectively. The beam waveguide includes the cladding layers 2, 4 of InP and the active layer 3 sandwiched by the cladding layers, and the oscillator structure is formed between the front- and rear-end surfaces.

Figure 20A:
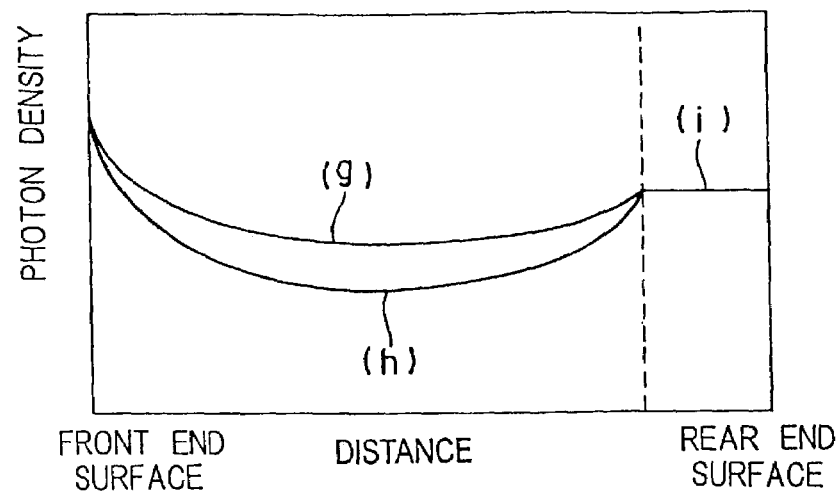
FIGS. 20A, 20B, and 20C are graphs illustrating photon density distribution, carrier density distribution, and refractive index distribution, respectively, with respect to distance from the front-end surface of the partial diffraction grading semiconductor laser device.
Figure 20B:
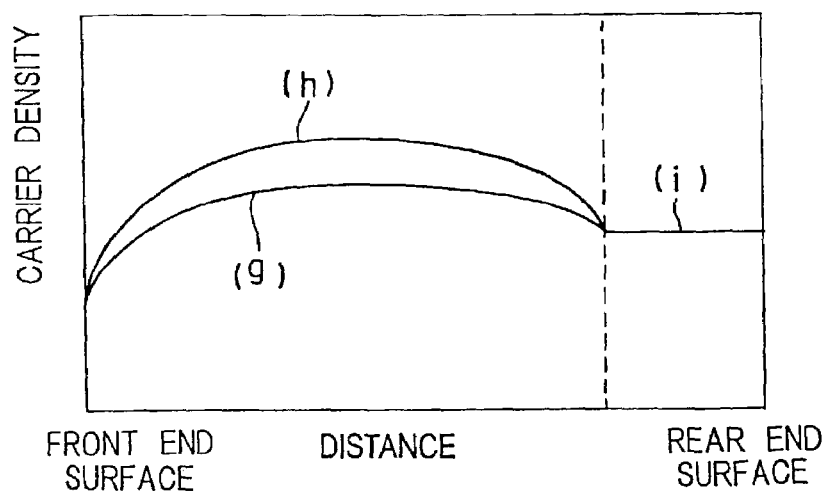
Figure 20C:
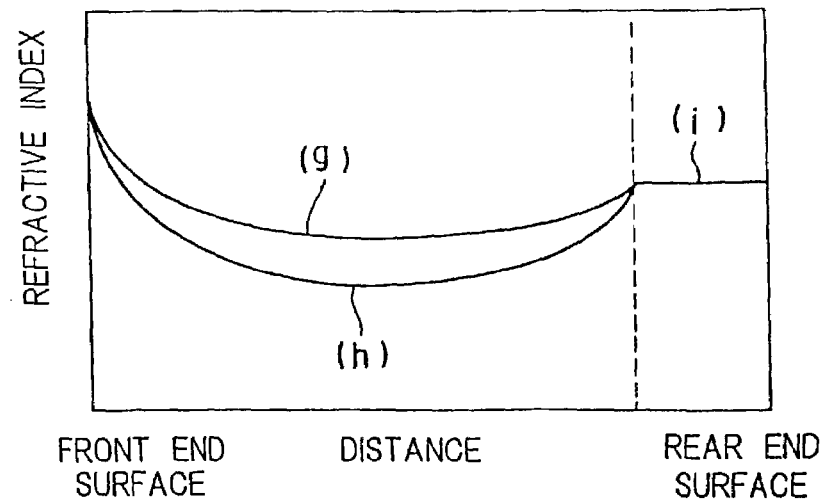
Figure 21:
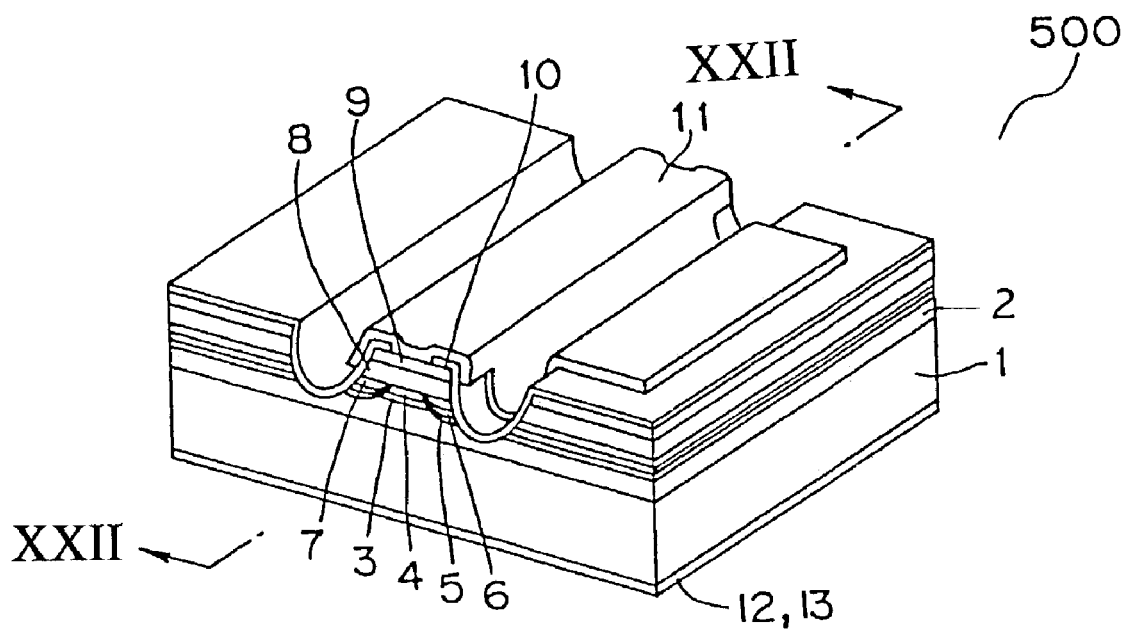
FIG. 21 is a perspective view of a conventional distributed-feedback semiconductor laser device.
Figure 22:
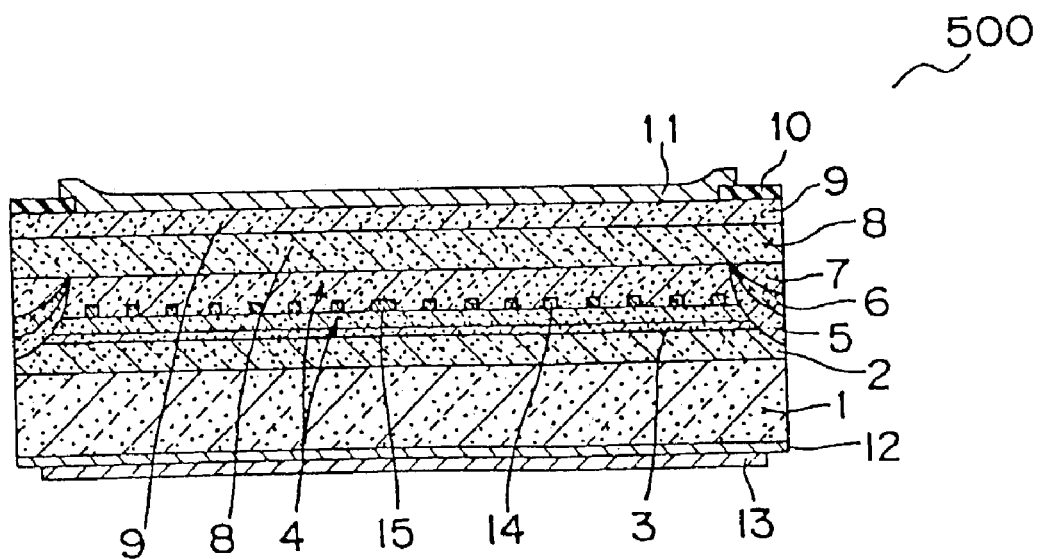
FIG. 22 is a cross sectional view, taken along the line XII—XII of FIG. 21, of the conventional distributed-feedback semiconductor laser device.

FIGS. 20A, 20B, and 20C are graphs illustrating distributions of the photon density, the carrier density, and the refractive index, respectively, within the oscillator (active layer 3) of the partial diffraction grading semiconductor laser device. The reference numerals (g) and (h) indicate the distributions of the partial diffraction grading semiconductor laser device according to the present embodiment and prior art device, respectively.

Unlike the other embodiments, the oscillator (active layer 3) of the partial diffraction grading semiconductor laser device of the present embodiment has, in general, the photon density greater in the first region adjacent to the front-end surface than in the second region adjacent to the middle point between both end surfaces (FIG. 20A). Thus, the carrier density is reduced in the region adjacent to the front-end surface rather than that in the region adjacent to the middle point (FIG. 20B), and accordingly, the plasma effect of the carrier is reduced in the region adjacent to the front-end surface as well. To this end, the refractive index is increased in the region adjacent to the front-end surface rather than that in the region adjacent to the middle point (FIG. 20C). This reduces the optical output and gives an adverse impact on the high power output of the oscillator.

To address this drawback, the partial diffraction grading semiconductor laser device according to the present embodiment is formed so that the oscillator (active layer 3) has the differential gain greater in the first region adjacent to the front-end surface where the photon density is greater than the region adjacent to the middle point. To this end, the variation (maximum-minimum range) of the refractive index within the oscillator (active layer 3) can be-reduced.

In particular, the partial diffraction grading semiconductor laser device 400 according to the present embodiment includes similar structures described with respect to Examples 1–3 of the first embodiment.

In the first structure of the partial diffraction grading semiconductor laser device 400, a plurality of quantum well layers of the active layer 3 has thickness modified to be thinner in the region adjacent to the front-end surface than in the other region of the active layer 3.

In the second structure of the partial diffraction grading semiconductor laser device 400, the detuning wavelength is increased in the region adjacent to the front-end surface than in the other region of the active layer 3.

In the third structure of the partial diffraction grading semiconductor laser device 400, the compressive strain of the well layer is increased in the region adjacent to the front-end surface than in the other region of the active layer 3.

The above-mentioned structures can be realized by the processes similar to those used for manufacturing the devices described in the examples of the first embodiment.

Therefore, the partial diffraction grading semiconductor laser device 400 of the present embodiment has the reduced variation of the refractive index between the core portion and the cladding portion of the beam waveguide. Also, since the stimulated emission reduces the carrier density in the region where the photon density is greater, a photoelectrical transferring efficiency is improved. This realizes a kink-free partial diffraction grading semiconductor laser device stabilizing a laser oscillation and obtaining a high optical performance.

As described above, the present invention realizes the kink-free semiconductor optical device stabilizing a laser oscillation and obtaining a high optical performance.

What is claimed is:

1. A semiconductor optical device, comprising a beam waveguide extending in a longitudinal direction between a pair of end surfaces, the beam waveguide including an active layer having a quantum well structure with at least one well layer and two barrier layers, and a pair of cladding layers sandwiching the active layer, the active layer having first and second regions in the longitudinal direction, the first region having, during operation of the semiconductor optical device a photon density larger than that of the second region, wherein the first region has a differential gain greater than that of the second region so that variation of refractive index across the beam waveguide is reduced.

2. The semiconductor optical device according to claim 1, including a plurality of well layers, wherein the well layers in the first region are thinner than the well layers in the second region.

3. The semiconductor optical device according to claim 1, wherein the active layer is composed of material selected so that a detuning wavelength of the active layer is larger in the first region than in the second region.

4. The semiconductor optical device according to claim 1, including a plurality of well layers, wherein the active layer is composed of material selected so that compressive strain of the well layers in the first region is greater than the compressive strain of the well layers in the second region.

5. The semiconductor optical device according to claim 1, further comprising a beam guiding layer on said beam waveguide and including a plurality of diffraction gratings, each diffraction grating having a predetermined spacing to an adjacent diffraction grating, the predetermined spacing determining oscillation wavelength of the beam waveguide, the beam guiding layer further including a phase shifting region adjacent to a middle point between the end surfaces, whereby the semiconductor optical device performs as a $\lambda/4$-shifted distributed-feedback semiconductor laser device, and wherein the first region of the active layer is adjacent the middle point.

6. The semiconductor optical device according to claim 5, wherein the beam guiding layer is thinner adjacent the middle point than adjacent to the end surfaces, whereby the diffraction gratings have a reduced variation of coupling coefficient along the longitudinal direction.

7. The semiconductor optical device according to claim 5, wherein the active layer has a plurality of the well layers and more of the well layers are adjacent the middle point than adjacent the end surfaces, whereby the diffraction gratings have a reduced variation of coupling coefficient along the longitudinal direction.

8. The semiconductor optical device according to claim 1, wherein a laser beam oscillates between the end surfaces, whereby the semiconductor optical device performs as a Fabry-Perot semiconductor laser device, and the first region of the active layer is adjacent the one of the end surfaces from which the laser beam is output.

9. The semiconductor optical device according to claim 1, further comprising a beam guiding layer on the beam waveguide having a plurality of diffraction gratings, each diffraction grating having a predetermined spacing to an adjacent diffraction grating, whereby the semiconductor optical device performs as a partial diffraction grading semiconductor laser device.

10. The semiconductor optical device according to claim 1, further comprising an external oscillator with resonance wavelength, the semiconductor optical device performs as a semiconductor laser device with an oscillation wavelength determined by the resonance wavelength, and the first region of one active layer is adjacent the one of the end surfaces from which the laser beam is output.

11. The semiconductor optical device according to claim 1, wherein
the semiconductor optical device performs as a traveling-wave semiconductor optical amplifier;
a laser beam is input at a first of the end surfaces, amplified within the beam waveguide, and output from a second of the end surfaces; and
the first region of the active layer is adjacent the second end surface.

* * * * *